United States Patent
Lin et al.

(10) Patent No.: US 7,287,205 B2
(45) Date of Patent: Oct. 23, 2007

(54) SIGNAL TESTING OF INTEGRATED CIRCUIT CHIPS

(75) Inventors: I-Ming Lin, Hsin-Tien (TW); Jen-Nan Liu, Hsin-Tien (TW)

(73) Assignee: Via Technologies, Inc., Taipei (TW)

( * ) Notice: Subject to any disclaimer, the term of this patent is extended or adjusted under 35 U.S.C. 154(b) by 482 days.

(21) Appl. No.: 10/614,040

(22) Filed: Jul. 8, 2003

(65) Prior Publication Data

US 2004/0123205 A1 Jun. 24, 2004

(30) Foreign Application Priority Data

Dec. 23, 2002 (TW) .............................. 91137020 A

(51) Int. Cl.
*G01R 31/28* (2006.01)
*G06F 11/00* (2006.01)
(52) U.S. Cl. ...................... 714/738; 714/745
(58) Field of Classification Search ................ 714/724
See application file for complete search history.

(56) References Cited

U.S. PATENT DOCUMENTS

| | | | | |
|---|---|---|---|---|
| 4,087,855 A | * | 5/1978 | Bennett et al. ............. | 710/100 |
| 4,090,236 A | * | 5/1978 | Bennett et al. ............. | 711/211 |
| 5,598,035 A | * | 1/1997 | Rusu et al. .................. | 257/723 |
| 6,735,543 B2 | * | 5/2004 | Douskey et al. ............ | 702/120 |
| 6,944,692 B2 | * | 9/2005 | Smith et al. ................ | 710/106 |
| 6,968,485 B2 | * | 11/2005 | Van Kirk ..................... | 714/724 |
| 6,998,892 B1 | * | 2/2006 | Nguyen et al. ............. | 327/161 |

OTHER PUBLICATIONS

"Validation And Test Issues Related to Noise Induced by Parasitic Inductances of VLSI Interconnects" by Sinha et al. IEEE Transactions on Advanced Packaging Publication Date: Aug. 2002 vol. 25 Issue: 3 pp. 329-339, INSPEC Accession No. 7496558.*

* cited by examiner

*Primary Examiner*—Cynthia Britt
(74) *Attorney, Agent, or Firm*—Rabin & Berdo, P.C.

(57) ABSTRACT

A method for testing signals of integrated circuits (ICs). According to the invention, a first IC chip successively drives a number of test patterns one at a time. At the receiving end, a second IC chip latches in the test patterns one by one. Meanwhile, the second IC chip determines whether a currently latched test pattern is correct or not. If it is incorrect and at least an error bit occurs, depending on the type of the test patterns, the second IC chip indicates that there exists ground bounce or power bounce in a signal trace corresponding to the error bit.

18 Claims, 3 Drawing Sheets

SIGNAL TESTING OF INTEGRATED CIRCUIT CHIPS

BACKGROUND OF THE INVENTION

1. Field of the Invention

The invention relates to integrated circuits, and more particularly to a mechanism for testing and fine-tuning the signal quality of integrated circuit (IC) chips.

2. Description of the Related Art

In computer systems, the general method for improving the data transfer rate is to raise the bus frequency or increase the data bus width. Growing bus width significantly increases the I/O density of IC chips. Although this is a common method in recent years, a great increase in the I/O density causes computer systems to be more susceptible to electromagnetic interference (EMI) caused by higher frequencies, and presents a difficult challenge in IC design, board layout and PCB manufacture.

Today, the most commonly encountered noise problems in high-speed systems are ground bounce and power bounce. The basic form of ground or power bounce occurs when the IC chip has multiple output pins changing state simultaneously. Such bounce types are referred to as simultaneous switching output (SSO) noise. For example, the least significant bit (LSB) of an 8-bit output is in the low state and the others are switching from high to low, that is, from "11111110" to "00000000". This creates an induced voltage across the parasitic inductance in the ground lead of the IC chip. Because the parasitic inductance is between the external system ground and the internal IC chip ground, the induced voltage causes the internal ground to be at a different potential than the external ground. This induced voltage is known as ground bounce as shown in FIG. 1. In this case, ground bounce on the LSB in the low state may be substantial enough to cross the input threshold of a subsequent device, which in turn can cause this device to misinterpret the static LSB as a logic "1". Power ground is the inverse of ground bounce. For example, the most significant bit (MSB) of an 8-bit output is in the high state and the others are switching from low to high, that is, from "10000000" to "11111111". This creates an induced voltage across the parasitic inductance in the power lead of the IC chip. FIG. 2 shows an exemplary graph of power bounce. In this case, power bounce on the MSB in the high state may be substantial enough to drop below the input threshold of a subsequent device, which in turn can cause this device to misinterpret the static MSB as logic "0".

Ground and power bounce problems can result in the unexpected, unreliable, and sometimes intermittent, behavior of a computer system. As data transfer rate increases, SSO noise becomes a crucial issue for high-speed IC design. Therefore, what is needed is a way for IC chips to quickly detect and effectively defeat SSO noise.

SUMMARY OF THE INVENTION

It is an object of the present invention to provide a method of signal testing, which permits an IC chip to easily and autonomously detect ground bounce and power bounce problems.

It is another object of the present invention to provide a signal adjustment method for IC chips to perform an internal adjustment automatically in order to overcome ground bounce and power bounce.

The present invention is generally directed to a method for testing signals of integrated circuits. According to one aspect of the invention, a first IC chip successively drives a plurality of test patterns one at a time. At a second IC chip, these test patterns are received to latch in one by one. Meanwhile, the second IC chip determines whether a currently latched test pattern is correct or not. If at least an error bit occurs in the currently latched test pattern, the second IC chip can indicate that there exists noise interference in a signal trace corresponding to the error bit. The above steps are repeated until the first IC chip finishes driving the test patterns.

According to another aspect of the invention, a plurality of test patterns are received and latched in one by one through an agent in integrated circuits. In the mean time, the agent determines whether a currently latched test pattern is correct or not. When at least an error bit occurs in the currently latched test pattern, the agent indicates that there exists noise interference in a signal trace corresponding to the error bit. In this case, the agent can adjust a reference voltage level in accordance with the type of the test pattern to change its input threshold. To change the output timing of the pin relative to the error bit, if necessary, the driving capability of that pin is further adjusted for the agent.

DESCRIPTION OF THE DRAWINGS

The present invention will be described by way of exemplary embodiments, but not limitations, illustrated in the accompanying drawings in which like references denote similar elements, and in which.

DETAILED DESCRIPTION OF THE INVENTION

The present invention exploits fixed and predicable test patterns to generate the simultaneous switching effects on board traces between driver and receiver IC chips as well as I/O pins thereof. In this manner, the potential problems of ground bounce and power bounce between the driver and receiver IC chips can be detected accordingly. The receiver IC chip automatically changes a reference voltage level to adjust its input threshold when an error is detected. If the error still occurs, the driver IC chip can further alter its driving capability to adjust output timing thereby avoiding running into ground or power bounce.

In accordance with the invention, driver and receiver IC chips individually have three types of built-in test patterns including a ground bounce type, a power bounce type and a heavy load type to detect various noise problems. With respect to the ground bounce type, a driver IC chip drives an initial test pattern consisting of all "1" and drives the remaining test patterns having bits transitioning to "0" from LSB to MSB sequentially. Taking 8-bit test patterns as an example, those patterns involved in the ground bounce type are driven in order as follows: "11111111"→"11111110"→"11111100"→ . . .

→"10000000"→"00000000". A receiver IC chip can accept such test patterns to determine whether any noise problems occur accordingly. With respect to the power bounce, the driver IC chip drives an initial test pattern consisting of all "0" and drives the remaining test patterns having bits transitioning to "1" from LSB to MSB sequentially, that is, "00000000"→"00000001"→"00000011"→ . . . →"01111111"→"11111111". In the case of the heavy load type, the driver IC chip drives a test pattern consisting of all "1" and switches the test pattern from all "1" to all "0" simultaneously except the LSB. This evaluates the LSB for ground bounce under a heavy load condition. Then the driver IC chip drives the test pattern consisting of all "1" again to evaluate the LSB for power bounce under the heavy load condition. After that, the test pattern is switched from all "1" to all "0" simultaneously except the MSB to evaluate the MSB for ground bounce under the heavy load condition. Finally, the driver IC chip drives the test pattern consisting of all "1" again to evaluate the MSB for power bounce under the heavy load condition. In other words, the test patterns involved in the heavy load type are driven in order as follows: "11111111"→"00000001"→"11111111"→"10000000"→"11111111". Additionally, the driver and the receiver IC chips both have an input pin to enable the inventive self-test mode; they also include a group of output pins to indicate a test error and its test pattern in accordance with the invention.

Figure 1:
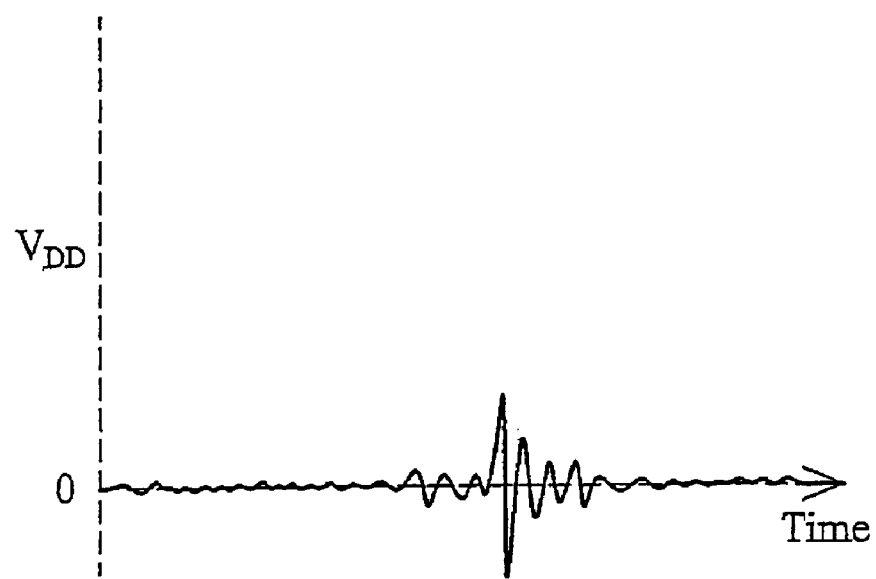
FIG. 1 is a graph illustrating an exemplary waveform of ground bounce.
Figure 2:
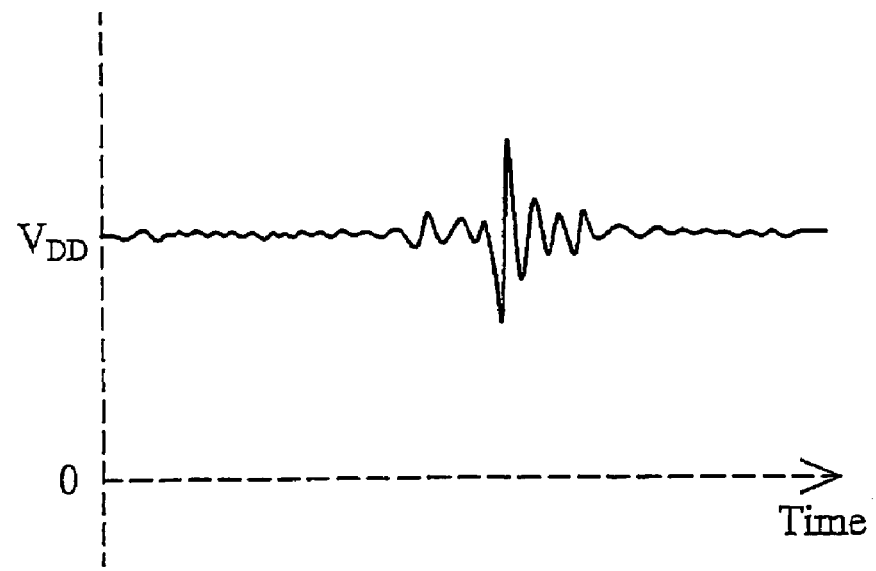
FIG. 2 is a graph illustrating an exemplary waveform of power bounce.
Figure 3:
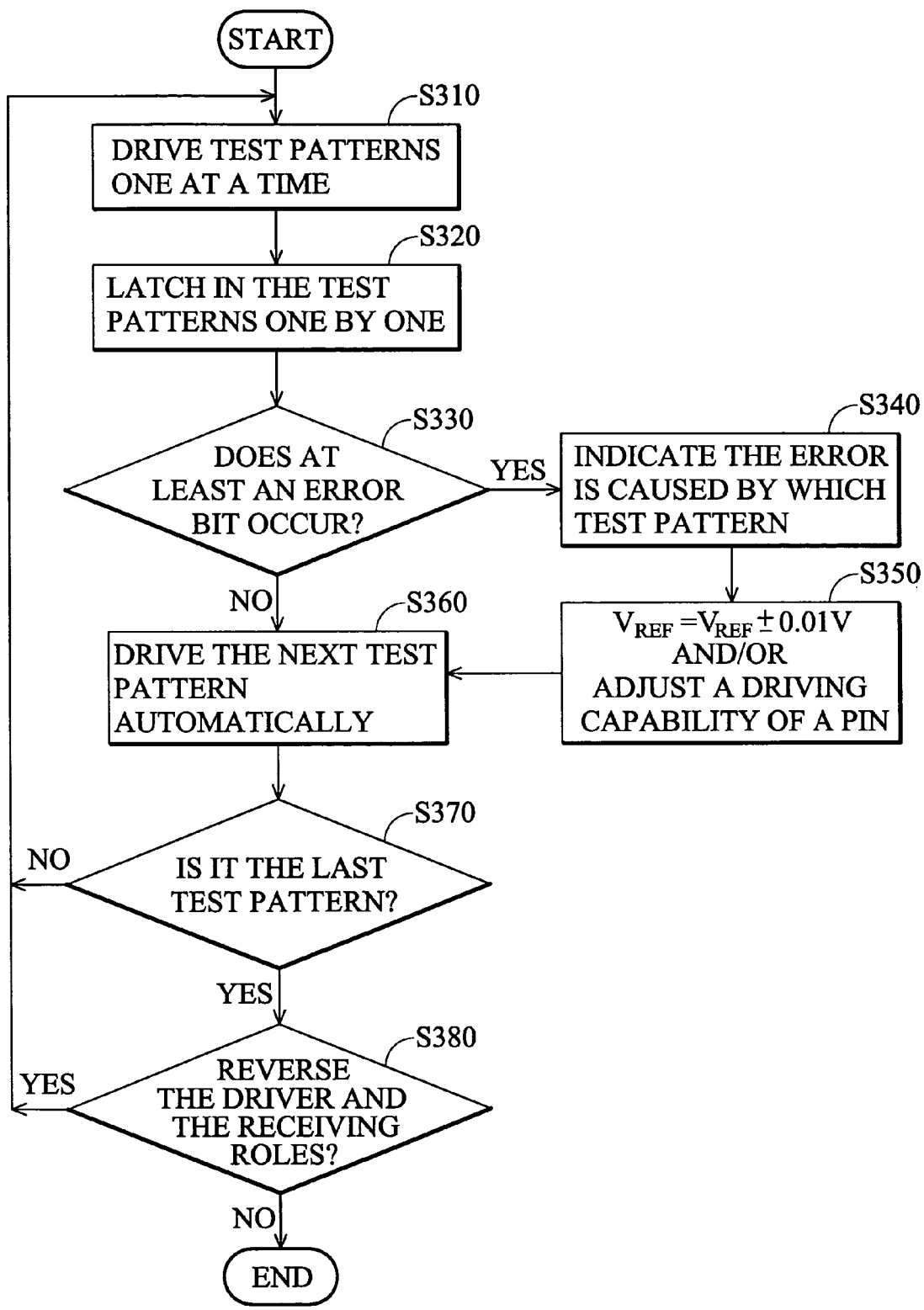
FIG. 3 is a flowchart of a preferred embodiment in accordance with the invention.

The features of the present invention will now be described in detail from a flowchart of FIG. 3. If the aforementioned input pins are fed with a specific signal to enable the self-test mode of the invention, then a first IC chip successively drives a number of test patterns one at a time (step S310). At a second IC chip, these test patterns are received to latch in one by one (step S320). Now the first IC chip serves as a driver while the second IC chip plays a receiving role. The second IC chip then determines whether a currently latched test pattern is correct or not (step S330). If at least an error bit occurs in the currently latched test pattern, the second IC chip can indicate that the error is caused by which test pattern (step S340). According to the type of that test pattern, the second IC chip also shows that there exists noise interference in a signal trace or I/O pin corresponding to the error bit. Once the currently latched test pattern is incorrect, the second IC chip automatically adjusts a reference voltage level $V_{REF}$ based on the related test pattern type to change an input threshold of the second IC chip. Optionally, the first IC chip can further adjust a driving capability of a pin relative to the error bit to change that pin's output timing in order to avoid encountering noise interference (step S350). The first IC chip drives the next test pattern automatically if the reference voltage level and/or the driving capability are adjusted properly (step S360). At the moment, this test pattern is checked to determine if it is the last one (step S370). If not, the above steps are repeated until the first IC chip finishes driving all test patterns. When finished, the first and the second IC chips decide whether the driver and the receiving roles should be reversed (step S380).

Figure 4:
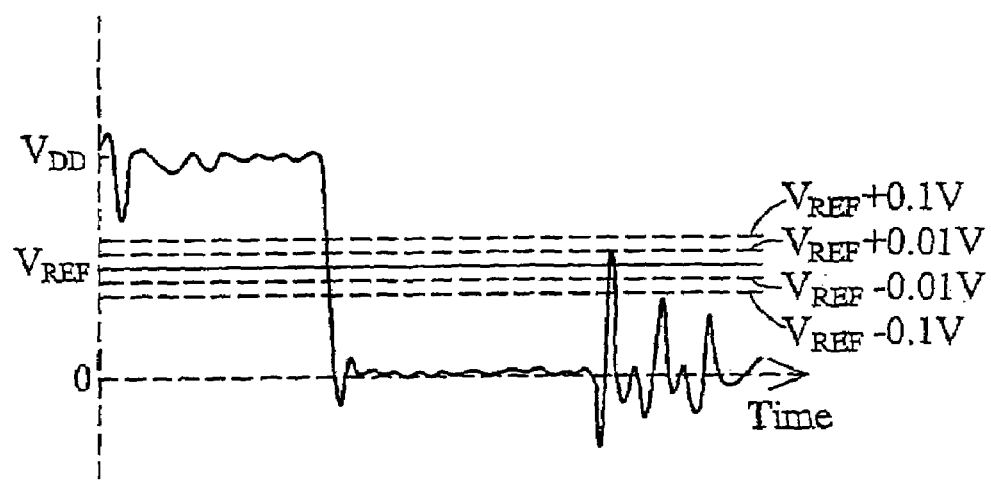
FIG. 4 is a diagram illustrating the adjustment of input threshold by altering the reference voltage level in accordance with the invention.
Figure 5:
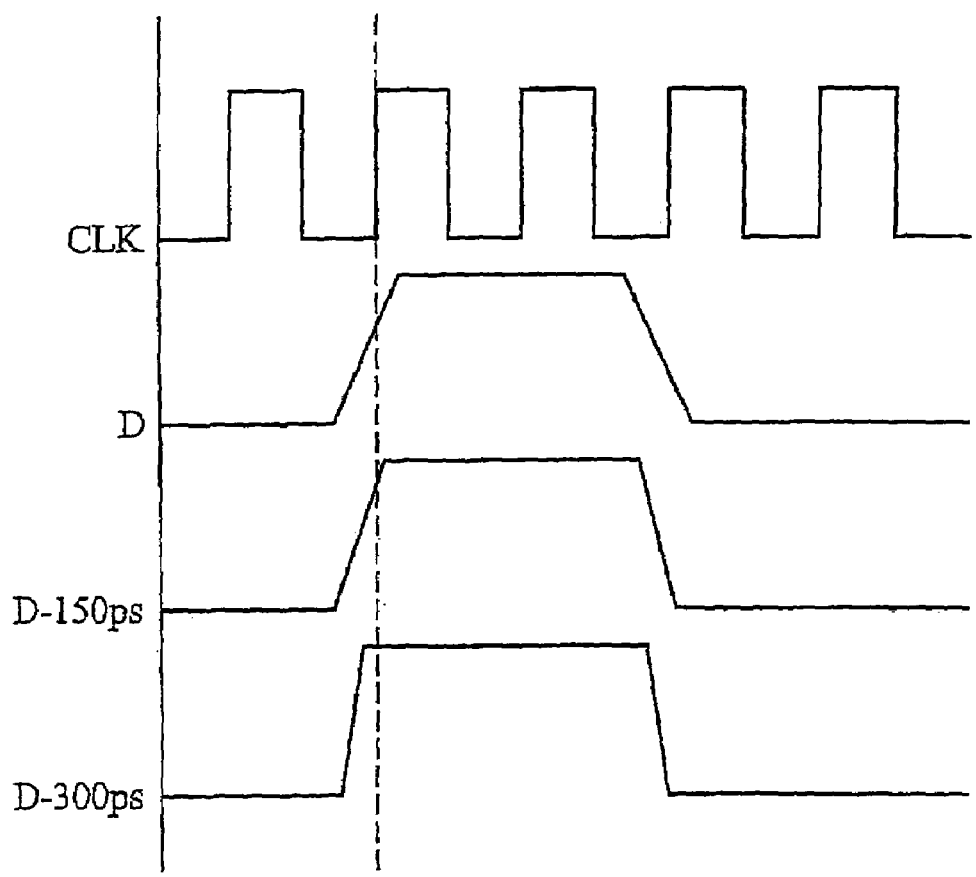
FIG. 5 is a diagram illustrating the adjustment of output timing by altering the driving capability in accordance with the invention.

In general, the input threshold of a digital IC chip is dependent on the reference voltage level $V_{REF}$. Furthermore, the digital IC chip latches in input data on the basis of its operating clock. If the input data is latched above $V_{REF}$, the digital IC chip determines that the latched data is a logic "1"; if the input data is latched below $V_{REF}$, the digital IC chip determines that the latched data is a logic "0". Since $V_{REF}$ is typically supplied by a voltage divider that is made up of external resistors, prior arts usually change the external resistors to manually adjust $V_{REF}$. In accordance with the invention, $V_{REF}$ can be adjusted by changing an internal register setting of the receiver IC chip. In one embodiment, the reference voltage level is adjusted in a unit of 0.01 volts at a time and its cumulative adjustment is limited to ±0.1 volts. Further, the driving capability can be altered to adjust the output timing by changing an internal register setting of the driver IC chip. In one embodiment, the output timing is changed in a unit of 150 ps at a time and its cumulative adjustment is limited to ±300 ps. The countermeasures against the power and bounce problems by means of altering the reference voltage level are illustrated in FIG. 4. In the case of the error caused by a test pattern belonging to the power bounce type, $V_{REF}$ is decreased to lower the input threshold of the receiver IC chip, i.e., $V_{REF}=V_{REF}-0.01V$. In the case of the error caused by a test pattern belonging to the ground bounce type, $V_{REF}$ is increased to raise the input threshold of the receiver IC chip, i.e., $V_{REF}=V_{REF}+0.01V$. To advance the output timing of the pin relative to the error bit, the driver IC chip increases the driving capability of that pin. Conversely, the driving capability of that pin is decreased to delay the pin's output timing. Referring to FIG. 5, waveform D is the original output signal, waveform D-150 ps represents the output signal subjected to an enhancement of driving capability, and waveform D-300 ps represents the output signal subjected to a further enhancement of driving capability. With respect to an operating clock CLK, the waveform D-150 ps is advanced by a time of 150 ps and the waveform D-300 ps is advanced by a time of 300 ps. By fine-tuning the output timing, a digital logic system can avoid encountering noise during the time that data is latched in.

In view of the above, the present invention discloses three types of test patterns for automatic detection of ground bounce and power bounce problems. The invention also proposes a way to overcome noise interference by means of adjusting the output timing and input threshold. Therefore, ground bounce and power bounce problems can be easily tested for in IC chips without the use of expensive instruments. With the help of the invention, it is not necessary to change circuit design or PCB layout to solve system problems caused by ground bounce and power bounce, and the product development time and cost can be reduced accordingly.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for testing signals of integrated circuits (ICs), comprising the steps of:
    successively driving, by a first IC chip, a plurality of test patterns one at a time;
    receiving, at a second IC chip, and latching in the test patterns one by one;
    determining, by the second IC chip, whether a currently latched test pattern is correct;
    if at least an error bit occurs in the currently latched test pattern, the second IC chip indicating that there exists noise interference in a signal trace corresponding to the error bit;

repeating the above steps until the first IC chip finishes driving the test patterns; and if the currently latched test pattern is incorrect, the second IC chip adjusting a reference voltage level in accordance with the type of the corresponding test pattern to change an input threshold of the second IC chip, wherein the reference voltage level is decreased to lower the input threshold of the second IC chip if the corresponding test pattern belongs to the power bounce type.

2. The method of claim 1 wherein the test patterns are at least divided into three types including a ground bounce type, a power bounce type and a heavy load type.

3. The method of claim 1 wherein the reference voltage level is adjusted in a unit of 0.01 volts at a time.

4. The method of claim 1 wherein the reference voltage level is adjusted by changing an internal register setting of the second IC chip.

5. The method of claim 1 further comprising the step of:
adjusting a driving capability of a pin relative to the error bit for the first IC chip to change the pin's output timing.

6. The method of claim 5 wherein the driving capability of the pin relative to the error bit is increased to advance the pin's output timing for the first IC chip.

7. The method of claim 5 wherein the driving capability of the pin relative to the error bit is decreased to delay the pin's output timing for the first IC chip.

8. The method of claim 5 wherein the output timing is changed in a unit of 150 ps at a time when adjusting the pin's driving capability for the first IC chip.

9. The method of claim 5 wherein the output timing is adjusted by changing an internal register setting of the first IC chip.

10. A method for testing signals of integrated circuits (ICs), comprising the steps of:
successively driving, by a first IC chip, a plurality of test patterns one at a time;
receiving, at a second IC chip, and latching in the test patterns one by one;
determining, by the second IC chip, whether a currently latched test pattern is correct;

if at least an error bit occurs in the currently latched test pattern, the second IC chip indicating that there exists noise interference in a signal trace corresponding to the error bit;

repeating the, above steps until the first IC chip finishes driving the test patterns; and if the currently latched test pattern is incorrect, the second IC chip adjusting a reference voltage level in accordance with the type of the corresponding test pattern to change an input threshold of the second IC chip, wherein the reference voltage level is increased to raise the input threshold of the second IC chip if the corresponding test pattern belongs to the ground bounce type.

11. The method of claim 10 wherein the test patterns are at least divided into three types including a ground bounce type, a power bounce type and a heavy load type.

12. The method of claim 10 wherein the reference voltage level is adjusted in a unit of 0.01 volts at a time.

13. The method of claim 10 wherein the reference voltage level is adjusted by changing an internal register setting of the second IC chip.

14. The method of claim 10 further comprising the step of:
adjusting a driving capability of a pin relative to the error bit for the first IC chip to change the pin's output timing.

15. The method of claim 14 wherein the driving capability of the pin relative to the error bit is increased to advance the pin's output timing for the first IC chip.

16. The method of claim 14 wherein the driving capability of the pin relative to the error bit is decreased to delay the pin's output timing for the first IC chip.

17. The method of claim 14 wherein the output timing is changed in a unit of 150 ps at a time when adjusting the pin's driving capability for the first IC chip.

18. The method of claim 14 wherein the output timing is adjusted by changing an internal register setting of the first IC chip.

* * * * *